(12) United States Patent
Hasper

(10) Patent No.: US 7,629,256 B2
(45) Date of Patent: Dec. 8, 2009

(54) IN SITU SILICON AND TITANIUM NITRIDE DEPOSITION

(75) Inventor: Albert Hasper, Meppel (NL)

(73) Assignee: ASM International N.V. (NL)

( * ) Notice: Subject to any disclaimer, the term of this patent is extended or adjusted under 35 U.S.C. 154(b) by 168 days.

(21) Appl. No.: 11/748,364

(22) Filed: May 14, 2007

(65) Prior Publication Data

US 2008/0286981 A1 Nov. 20, 2008

(51) Int. Cl.
    *H01L 21/44* (2006.01)
(52) U.S. Cl. .............................. 438/680; 257/E21.101
(58) Field of Classification Search ............... 438/485, 438/597, 680–681; 118/715; 427/96.8
    See application file for complete search history.

(56) References Cited

U.S. PATENT DOCUMENTS

| | | |
|---|---|---|
| 2,865,791 A | 12/1958 | Ruppet et al. |
| 4,188,444 A | 2/1980 | Landau |
| 4,262,631 A | 4/1981 | Kubacki |
| 4,277,320 A | 7/1981 | Beguwala et al. |
| 4,279,947 A | 7/1981 | Goldman et al. |
| 4,298,629 A | 11/1981 | Nozaki et al. |
| 4,363,828 A | 12/1982 | Brodsky et al. |
| 4,389,973 A | 6/1983 | Suntola et al. |
| 4,402,997 A | 9/1983 | Hogan et al. |
| 4,413,022 A | 11/1983 | Suntola et al. |
| 4,428,975 A | 1/1984 | Dahm et al. |
| 4,495,218 A | 1/1985 | Azuma et al. |
| 4,535,000 A | 8/1985 | Gordon |
| 4,570,328 A | 2/1986 | Price et al. |
| 4,585,671 A | 4/1986 | Kitagawa et al. |
| 4,684,542 A | 8/1987 | Jasinski et al. |
| 4,699,805 A | 10/1987 | Seelbach et al. |
| 4,715,937 A | 12/1987 | Moslehi et al. |
| 4,803,127 A | 2/1989 | Hakim |
| 4,834,020 A | 5/1989 | Bartholomew et al. |
| 4,851,095 A | 7/1989 | Scobey et al. |
| 4,855,254 A | 8/1989 | Eshita et al. |
| 4,935,661 A | 6/1990 | Heinecke et al. |
| 4,943,581 A | 7/1990 | Hidaka et al. |

(Continued)

FOREIGN PATENT DOCUMENTS

DE   101 32 882 A1   12/2002

(Continued)

OTHER PUBLICATIONS

European Search Report for counterpart EP Application No. 05011705.

(Continued)

*Primary Examiner*—W. David Coleman
*Assistant Examiner*—Daniel Shook
(74) *Attorney, Agent, or Firm*—Knobbe, Martens, Olson & Bear LLP

(57) ABSTRACT

A method of processing semiconductor wafers is provided, comprising loading a batch of semiconductor wafers into a processing chamber; depositing titanium nitride (TiN) onto the wafers in the processing chamber; and depositing silicon onto the wafers in the processing chamber, without removing the wafers from the processing chamber between said depositing steps. In preferred embodiments, the TiN and silicon depositing steps are both conducted at temperatures within about 400-550° C., and at temperatures within 100° C. of one another.

14 Claims, 9 Drawing Sheets

U.S. PATENT DOCUMENTS

| | | | |
|---|---|---|---|
| 5,015,330 A | 5/1991 | Okumura et al. |
| 5,111,266 A | 5/1992 | Furumura et al. |
| 5,214,002 A | 5/1993 | Hayashi et al. |
| 5,227,329 A | 7/1993 | Kobayashi et al. |
| 5,246,881 A | 9/1993 | Sandhu et al. |
| 5,279,857 A | 1/1994 | Eichman et al. |
| 5,287,205 A | 2/1994 | Yamazaki et al. |
| 5,308,655 A | 5/1994 | Eichman et al. |
| 5,356,673 A | 10/1994 | Schmitt et al. |
| 5,356,821 A | 10/1994 | Naruse et al. |
| 5,389,398 A | 2/1995 | Suzuki et al. |
| 5,389,570 A | 2/1995 | Shiozawa |
| 5,453,858 A | 9/1995 | Yamazaki |
| 5,471,330 A | 11/1995 | Sarma |
| 5,607,724 A | 3/1997 | Beinglass et al. |
| 5,614,257 A | 3/1997 | Beinglass et al. |
| 5,648,293 A | 7/1997 | Hayama et al. |
| 5,656,531 A | 8/1997 | Thakur et al. |
| 5,672,385 A | 9/1997 | Jimba et al. |
| 5,695,819 A | 12/1997 | Beinglass et al. |
| 5,698,771 A | 12/1997 | Shields et al. |
| 5,700,520 A | 12/1997 | Beinglass et al. |
| 5,723,382 A | 3/1998 | Sandhu et al. |
| 5,741,330 A | 4/1998 | Brauker et al. |
| 5,769,950 A | 6/1998 | Takasu et al. |
| 5,786,027 A | 7/1998 | Rolfson |
| 5,789,030 A | 8/1998 | Rolfson |
| 5,837,580 A | 11/1998 | Thakur |
| 5,849,601 A | 12/1998 | Yamazaki |
| 5,874,129 A | 2/1999 | Beinglass et al. |
| 5,876,797 A | 3/1999 | Beinglass et al. |
| 5,885,869 A | 3/1999 | Turner et al. |
| 5,907,792 A | 5/1999 | Droopad et al. |
| 5,916,365 A | 6/1999 | Sherman |
| 5,925,188 A | 7/1999 | Oh |
| 5,959,326 A | 9/1999 | Aiso et al. |
| 5,959,327 A | 9/1999 | Sandhu et al. |
| 6,015,590 A | 1/2000 | Suntola et al. |
| 6,027,705 A | 2/2000 | Kitsuno et al. |
| 6,056,823 A | 5/2000 | Sajoto et al. |
| 6,083,810 A | 7/2000 | Obeng et al. |
| 6,087,229 A | 7/2000 | Aronowitz et al. |
| 6,103,600 A | 8/2000 | Ueda et al. |
| 6,136,654 A | 10/2000 | Kraft et al. |
| 6,136,690 A | 10/2000 | Li |
| 6,159,828 A | 12/2000 | Ping et al. |
| 6,161,498 A | 12/2000 | Toraguchi et al. |
| 6,171,662 B1 | 1/2001 | Nakao |
| 6,180,462 B1 | 1/2001 | Hsu |
| 6,197,669 B1 | 3/2001 | Twu et al. |
| 6,197,694 B1 | 3/2001 | Beinglass |
| 6,200,893 B1 | 3/2001 | Sneh |
| 6,203,613 B1 | 3/2001 | Gates et al. |
| 6,228,181 B1 | 5/2001 | Yamamoto et al. |
| 6,252,295 B1 | 6/2001 | Cote et al. |
| 6,271,054 B1 | 8/2001 | Ballantine et al. |
| 6,294,399 B1 | 9/2001 | Fukumi et al. |
| 6,326,311 B1 | 12/2001 | Ueda et al. |
| 6,348,420 B1 | 2/2002 | Raaijmakers et al. |
| 6,373,112 B1 | 4/2002 | Murthy et al. |
| 6,385,020 B1 | 5/2002 | Shin et al. |
| 6,390,753 B1 | 5/2002 | De Ridder |
| 6,391,803 B1 | 5/2002 | Kim et al. |
| 6,455,892 B1 | 9/2002 | Okuno et al. |
| 6,468,924 B2 | 10/2002 | Lee et al. |
| 6,503,846 B1 | 1/2003 | Niimi et al. |
| 6,524,650 B1 | 2/2003 | Shimahara et al. |
| 6,528,530 B2 | 3/2003 | Zeitilin et al. |
| 6,537,910 B1 | 3/2003 | Burke et al. |
| 6,551,893 B1 | 4/2003 | Zheng et al. |
| 6,573,184 B2 | 6/2003 | Park |
| 6,585,823 B1 | 7/2003 | Van Wijck |
| 6,593,219 B2 | 7/2003 | Matsumoto et al. |
| 6,613,695 B2 | 9/2003 | Pomarede et al. |
| 6,638,879 B2 | 10/2003 | Hsich et al. |
| 6,656,282 B2 | 12/2003 | Kim et al. |
| 6,663,332 B1 | 12/2003 | Sluijk et al. |
| 6,749,687 B1 | 6/2004 | Ferro et al. |
| 6,814,572 B2 | 11/2004 | Okabe |
| 6,821,825 B2 | 11/2004 | Todd et al. |
| 6,824,816 B2 | 11/2004 | Aaltonen et al. |
| 6,825,134 B2 | 11/2004 | Law et al. |
| 6,924,223 B2 | 8/2005 | Yamasaki et al. |
| 6,962,859 B2 | 11/2005 | Todd et al. |
| 6,991,684 B2 | 1/2006 | Kannan et al. |
| 6,998,686 B2 | 2/2006 | Chau et al. |
| 7,005,392 B2 | 2/2006 | Baum et al. |
| 7,091,085 B2 | 8/2006 | Shea |
| 7,112,488 B2 | 9/2006 | Helm et al. |
| 2001/0025605 A1 | 10/2001 | Nagakura |
| 2001/0032986 A1 | 10/2001 | Mitsutoshi |
| 2002/0047151 A1 | 4/2002 | Kim et al. |
| 2002/0073925 A1 | 6/2002 | Noble et al. |
| 2002/0098627 A1 | 7/2002 | Pomarede et al. |
| 2002/0121242 A1 | 9/2002 | Minami et al. |
| 2002/0124800 A1 | 9/2002 | Moriyama |
| 2002/0160605 A1 | 10/2002 | Kanzawa et al. |
| 2002/0168868 A1 | 11/2002 | Todd |
| 2002/0176939 A1* | 11/2002 | Mandrekar ................. 427/250 |
| 2002/0197831 A1 | 12/2002 | Todd et al. |
| 2003/0022528 A1 | 1/2003 | Todd |
| 2003/0059535 A1 | 3/2003 | Luo et al. |
| 2003/0082300 A1 | 5/2003 | Todd et al. |
| 2003/0111013 A1 | 6/2003 | Oosterlaken et al. |
| 2003/0134038 A1 | 7/2003 | Paranjpe |
| 2003/0143841 A1 | 7/2003 | Yang et al. |
| 2003/0148605 A1 | 8/2003 | Shimogaki et al. |
| 2003/0176047 A1 | 9/2003 | Doan et al. |
| 2004/0025786 A1 | 2/2004 | Kontani et al. |
| 2004/0129212 A1 | 7/2004 | Gadgil et al. |
| 2004/0221807 A1 | 11/2004 | Verghese et al. |
| 2004/0224504 A1 | 11/2004 | Gadgil |
| 2004/0235314 A1 | 11/2004 | Takimoto |
| 2004/0250765 A1 | 12/2004 | Ishizaka et al. |
| 2005/0039680 A1 | 2/2005 | Beaman et al. |
| 2005/0042373 A1 | 2/2005 | Kraus et al. |
| 2005/0045102 A1 | 3/2005 | Zheng et al. |
| 2005/0064684 A1 | 3/2005 | Todd et al. |
| 2005/0079692 A1 | 4/2005 | Samoilov et al. |
| 2005/0118837 A1 | 6/2005 | Todd et al. |
| 2005/0205942 A1* | 9/2005 | Lin et al. ................... 257/388 |
| 2005/0250077 A1 | 11/2005 | Todd et al. |
| 2005/0287806 A1 | 12/2005 | Matsuura |
| 2006/0060137 A1 | 3/2006 | Hasper et al. |
| 2006/0068104 A1 | 3/2006 | Ishizaka et al. |
| 2006/0088985 A1 | 4/2006 | Haverkort et al. |
| 2006/0189168 A1 | 8/2006 | Sato et al. |
| 2007/0077775 A1 | 4/2007 | Hasper et al. |
| 2007/0084404 A1 | 4/2007 | Verghese et al. |
| 2008/0003838 A1 | 1/2008 | Haukka et al. |

FOREIGN PATENT DOCUMENTS

| | | |
|---|---|---|
| EP | 0 368 651 A2 | 5/1990 |
| EP | 0 442 490 A1 | 8/1991 |
| EP | 0 486 047 A2 | 5/1992 |
| EP | 0 526 779 A1 | 2/1993 |
| EP | 0 747 974 A2 | 12/1996 |
| EP | 1 065 728 A2 | 1/2001 |
| GB | 2 298 313 A | 8/1996 |
| GB | 2 332 564 A | 6/1999 |
| JP | 57-209810 | 12/1982 |
| JP | 59-078918 | 5/1984 |
| JP | 59-078919 | 5/1984 |

| | | |
|---|---|---|
| JP | 60-043485 | 3/1985 |
| JP | 60-245233 | 12/1985 |
| JP | 61-153277 | 7/1986 |
| JP | 62-076612 | 4/1987 |
| JP | 63-003414 | 1/1988 |
| JP | 63-003463 | 1/1988 |
| JP | 64-081311 | 3/1989 |
| JP | 1-217956 | 8/1989 |
| JP | 1-268064 | 10/1989 |
| JP | 2-155225 | 6/1990 |
| JP | 3-091239 | 4/1991 |
| JP | 3-185817 | 8/1991 |
| JP | 3-187215 | 8/1991 |
| JP | 3-292741 | 12/1991 |
| JP | 4-323834 | 11/1992 |
| JP | 5-021378 | 1/1993 |
| JP | 5-062911 | 3/1993 |
| JP | 5062911 | 3/1993 |
| JP | 7-249618 | 9/1995 |
| JP | 8-242006 | 9/1996 |
| JP | 11317530 | 11/1999 |
| JP | 2004-096060 | 3/2004 |
| WO | WO 02/064853 | 8/2002 |
| WO | WO 03/008663 A1 | 1/2003 |
| WO | WO 2004/008491 A2 | 1/2004 |
| WO | WO 2004/008491 A3 | 1/2004 |
| WO | WO 2004/009861 A2 | 1/2004 |

OTHER PUBLICATIONS

Hillman et al., "Properties of LPCVD TiN Barrier Layers," Microelectronic Engineering 19 (1992) 375-378.

Hiltunen et al., "Nitrides of Titanium, Niobium, Tantalum and Molybdenum Grown as Thin Films by the Atomic Layer Epitaxy Method," Thin Solid Films, 166 (1988) 149-154.

Hiramatsu et al., Formation of TiN Films with Low Cl Concentration by Pulsed Plasma Chemical Vapor Deposition, J. Vac. Sci. Technol. A, 14(3) May/Jun. 1996.

Ikoma et al., Growth of Si/3C-SiC/Si(100) hetrostructures by pulsed supersonic free jets, Applied Physics Letters, vol. 75, No. 25, pp. 3977-3979, Dec. 1999.

International Search Report dated Nov. 13, 2003 for international patent application No. PCT/US02/02921, filed on Feb. 1, 2002.

International Search Report dated May 8, 2007 for international patent application No. PCT/US2006/047805.

Pintchovski et al., "LPCVD titanium nitride-deposition, properties, and application to ULSI", *Tungsten and Other Refractory Metal for ULSI Application*, No. IV, pp. 275-282, (1989).

Ramanuja, et al., "Synthesis and characterization of low pressure chemically vapor deposited titanium nitride films using $TiCl_4$ and $NH_3$," Materials Letters 57 (2002) 261-269.

Sze, VLSI Technology, "Arrhenius plot for polysilicon deposition for different silane partial pressures," (1988) pp. 240-241.

Travis et al., "A scalable submicron contact technology using conformal LPCVD TiN", *IIDEM Conference Proceedings*, Dec. 1990.

Office Action of Aug. 21, 2008 in U.S. Appl. No. 11/843,552, filed Aug. 22, 2007.

* cited by examiner

IN SITU SILICON AND TITANIUM NITRIDE DEPOSITION

FIELD OF THE INVENTION

The present application relates generally to semiconductor processing, and more particularly to silicon and titanium nitride deposition.

INCORPORATION BY REFERENCE

The present application incorporates by reference the full disclosures of the following: U.S. Pat. No. 6,746,240; U.S. Pat. No. 6,962,859; U.S. Patent Application Publication No. 2003/0111013 A1; U.S. Patent Application Publication No. 2004/0250853 A1; U.S. Patent Application Publication No. 2005/0118837 A1; U.S. Patent Application Publication No. 2006/0060137 A1; U.S. Patent Application Publication No. 2006/0088985 A1; and Sze, VLSI TECHNOLOGY, pp. 240-41 (1988).

BACKGROUND

High-temperature ovens, called reactors, are used to create structures of very fine dimensions, such as integrated circuits on semiconductor substrates. One or more substrates, such as silicon wafers, are placed on a substrate support inside the reaction chamber. Both the substrate and support are heated to a desired temperature. In a typical substrate treatment step, reactant gases (also referred to as precursors) are passed over the heated substrate, causing the deposition (e.g., chemical vapor deposition, or CVD) of a thin layer on the substrate. CVD is typically conducted at high temperatures, such as 250-900° C.

Deposition equipment normally includes a system for delivering gas to the reaction chamber. The gas delivery system typically comprises a plurality of precursor sources, optionally one carrier gas and/or purge gas source, a network of pipes for delivering the precursor gases to the reaction chamber, eventually an injection manifold or showerhead for injecting the gas evenly into the chamber, and a number of valves for controlling the gas flow. Also, some precursor sources may be in powder or liquid form, and means for vaporizing such precursors can be provided (e.g., bubblers).

Another type of deposition process is atomic layer deposition (ALD). In ALD, two complementary precursors are alternatively introduced into the reaction chamber. Typically, a first precursor will adsorb onto the substrate surface, but it cannot completely decompose without the second precursor. The first precursor adsorbs until it saturates the substrate surface; further growth cannot occur until the second precursor is introduced. Thus, the film thickness is controlled by the number of precursor injection cycles rather than the deposition time, as is the case for conventional CVD processes. Accordingly, ALD allows for extremely precise control of film thickness and uniformity. ALD is typically conducted at temperatures in a range 250-500° C.

In ALD, the reaction chamber is typically pulsed with a non-reactive protective gas between injections of the two precursor gases, in an attempt to rid the chamber of any excess of the preceding precursor gas. Otherwise, the excess preceding precursor would intermix and react with the subsequently pulsed precursor to form unwanted CVD-type growth on the substrate surface and/or on surfaces of the chamber.

For various reasons, including low electrical resistivity, good thermal stability, and good diffusion barrier properties, there are numerous applications for titanium nitride (TiN) in the fabrication of integrated circuits. Exemplary applications include use as a contact or barrier layer and as an electrode in electrical devices, such as transistors.

The properties of TiN, however, are closely dependent on processing and deposition parameters. Thus, the suitability and desirability of deposited TiN for a particular application can depend on the availability of a deposition process able to form TiN with desired properties, e.g., high uniformity and low resistivity. As a result, research into the development of new TiN deposition processes is on-going.

For example, the Low Pressure Chemical Vapor Deposition (LPCVD) of TiN films in a hot wall furnace has been described by N. Ramanuja et al. in Materials Letters, Vol. 57 (2002), pp. 261-269. The reach of Ramanuja et al. is limited, however, as Ramanuja et al. investigated 100 mm wafers, rather than industry standard 200 mm and 300 mm wafers.

In addition to being able to form acceptable TiN films, it is desirable for the deposition temperature of the TiN deposition process to be relatively low, thereby increasing flexibility for integrating the deposition process with other processes and structures. For example, reducing deposition temperatures to the 400-500° C. range allows the films to be used in conjunction with multi-level aluminum or copper metallization.

It has been found, however, that a reduction in the deposition temperature results in the incorporation of significant amounts of chlorine in the TiN film and results in a substantial increase in resistivity, which is undesirable. See J. T. Hillman, Microelectronic Engineering, Vol. 19 (1992), pp. 375-378. To reduce the resistivity and the chlorine content of the film, Hilman discloses a single wafer deposition process followed by a post-deposition anneal. Undesirably, however, such a process requires an additional process step and also limits throughput by using single wafer processing.

SUMMARY

It is an object and advantage of the present application to provide viable methods for in situ deposition of TiN and silicon onto substrates in a batch reactor.

In one aspect, a method of processing semiconductor wafers is provided. A batch of semiconductor wafers is loaded into a processing chamber. Titanium nitride (TiN) is deposited onto the wafers in the processing chamber. Silicon is deposited onto the wafers in the processing chamber, without removing the wafers from the processing chamber between said depositing steps.

In another aspect, an apparatus comprises a processing chamber, titanium precursor source, nitrogen precursor source, silicon precursor source, and valve system. The processing chamber is configured to contain a plurality of semiconductor wafers. The titanium, nitrogen, and silicon precursor sources are each connected to the chamber to deliver a vapor of the titanium, nitrogen, and silicon precursor, respectively, into the chamber. The valve system is configured to allow selective control of delivery of the vapors into the chamber.

For purposes of summarizing the present application and the advantages achieved over the prior art, certain objects and advantages have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

All of these embodiments are intended to be within the scope of the invention. These and other embodiments of the present invention will become readily apparent to those skilled in the art from the following detailed description of the preferred embodiments having reference to the attached figures, the invention not being limited to any particular preferred embodiment(s) disclosed.

BRIEF DESCRIPTION OF THE DRAWINGS

The invention will be better understood from the Detailed Description of the Preferred Embodiments and from the appended drawings, which are meant to illustrate and not to limit the invention, and wherein.

DETAILED DESCRIPTION OF THE PREFERRED EMBODIMENTS

Overview

Figure 1:
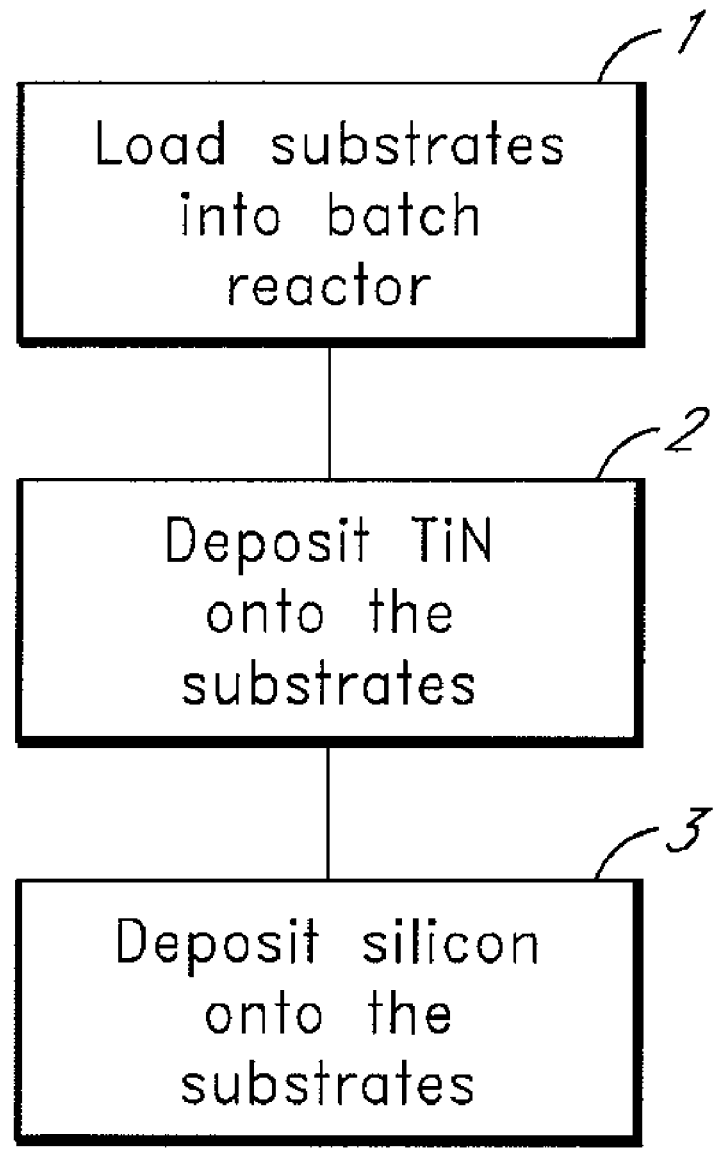
FIG. 1 is a flow chart illustrating a method of in situ deposition of TiN and silicon onto substrates within a batch reactor.

It has recently been found that uniform and low resistivity TiN films can be economically deposited onto substrates in a batch reactor by periodically introducing, or pulsing, one or more precursors into the reaction chamber of the reactor. For example, U.S. Patent Application Publication No. 2006/0060137 A1 to Hasper et al. discloses forming TiN films using stable titanium and nitrogen precursors, i.e., precursors that are not radicals or a plasma. Hasper et al. disclose two general methods: (1) alternately pulsing a titanium precursor (such as titanium tetrachloride, $TiCl_4$) and a nitrogen precursor (such as ammonia, $NH_3$) into the reaction chamber; and (2) continuously flowing one of the precursors (such as $NH_3$) into the reaction chamber while pulsing the other precursor (such as $TiCl_4$). Hasper et al. found that these methods allow for the deposition of TiN films with good uniformity and low resistivity on industry size wafers, such as 200 mm or 300 mm wafers. Furthermore, Hasper et al. found that such methods allow for TiN deposition at lower temperatures (e.g., between 450-600° C.), such that the deposition is compatible with other processes such as multi-level aluminum or copper metallization.

A TiN film is susceptible to oxidation. Typically, a protective polysilicon capping film is deposited onto the TiN film shortly after the TiN film is deposited, to protect the TiN film from oxidation. Current methods involve depositing the TiN and the silicon capping film in two different reactors, because silicon deposition is normally conducted at temperatures that are significantly higher than the preferred temperature range for depositing TiN (e.g., 450-500° C., as taught by U.S. Patent Application Publication No. 2006/0060137 A1 to Hasper et al.). A primary reason why TiN and silicon have been deposited in separate reactors, as opposed to depositing both layers at different temperatures within the same reactor, is because changes in temperature of a process tube used for depositing silicon (e.g., polysilicon) lead to unacceptable amounts of particle generation in the reaction chamber, which adversely affects the quality of deposited films. As well understood, the deposition of silicon onto substrates in a reaction chamber also results in silicon deposition onto the reaction chamber walls. It is usually the case that the deposited silicon and the chamber walls have different coefficients of thermal expansion. For example, radiantly heated reaction chambers are typically formed of quartz walls, and the coefficients of thermal expansion of quartz and silicon are 0.59 ppm/K and 2.3 ppm/K, respectively. If the temperature is varied significantly, the chamber walls and the silicon deposited thereon will expand and contract at different rates. This causes silicon particles to flake off of the walls, thereby contaminating the chamber. For this reason, it is generally not desirable to change the temperature in a reaction chamber used for silicon deposition.

This problem also arises when TiN and silicon are deposited at different temperatures as adjacent layers on substrates. TiN has a coefficient of thermal expansion of 9.3 ppm/K. Thus, if TiN is deposited at one temperature (e.g., 450-500° C.) and silicon is deposited onto the TiN at a significantly higher temperature, there would be an unacceptable risk of flaking and particle generation caused by the differential in thermal expansion and contraction of the silicon and the TiN.

Another reason why TiN and silicon have been deposited in separate reactors, as opposed to depositing both layers at different temperatures within the same reactor, is that it takes longer to wait for the temperature to change and stabilize throughout the chamber (particularly for a batch reactor) than it takes to transfer the one or more substrates to another chamber maintained at a different temperature. At the relatively low temperature used for TiN deposition, heat transport through radiation is limited. Heat transport by conduction is also not very efficient for a stack of substrates in a batch furnace at low pressure. Consequently, temperature stabilization is slow, and it is often less time consuming to transfer the substrates to another chamber.

The practice of depositing TiN and silicon in different reactors involves several problems and drawbacks. The need to transfer substrates between two separate reactors involves greater equipment costs and more complicated processing, and results in lower throughput. Further, while transferring the substrate with the TiN film from the TiN deposition reactor to a silicon deposition reactor, the TiN becomes exposed to air, which leads to an undesirable interface between the TiN and the silicon capping film.

Embodiments of the present application involve depositing a TiN film and an amorphous silicon capping film onto a plurality of substrates in a single batch reactor in situ, without removing the substrates from the processing chamber between these deposition steps. By depositing both films in the same reactor, it is possible to avoid the formation of an undesired interface between the TiN and the polysilicon capping film. The elimination of one reactor reduces costs. Also, the elimination of the intermediate substrate transfer step simplifies the processing logistics and increases substrate throughput.

FIG. 1 illustrates the process. First, a plurality of substrates, such as semiconductor wafers, is loaded 1 into a processing chamber of a batch reactor. TiN is deposited 2 onto the wafers in the processing chamber. Silicon is deposited 3 onto the wafers in the processing chamber, without removing the wafers from the processing chamber between said depositing steps 2 and 3.

"Substrate" is used herein in its usual sense to include any underlying surface onto which a material is deposited or applied. Preferred substrates include semiconductor wafers, such as silicon wafers. However, substrates can be made of virtually any material, including without limitation metal, silicon, germanium, plastic, and/or glass, preferably silicon compounds (including Si—O—C—H low dielectric constant films) and silicon alloys. Substrates can also have in them physical structures such as trenches or steps, as in a partially fabricated integrated circuit.

In some embodiments, the TiN deposition is conducted in accordance with the aforementioned methods taught by U.S. Patent Application Publication No. 2006/0060137 A1 to Hasper et al.: (1) alternately pulsing a titanium precursor (such as $TiCl_4$) and a nitrogen precursor (such as $NH_3$) into the reaction chamber, preferably with purge or evacuation steps therebetween; and (2) continuously flowing one of the precursors (such as $NH_3$) into the reaction chamber while pulsing the other precursor (such as $TiCl_4$). In other embodiments, the TiN deposition involves the following cyclical sequence: substantially simultaneous pulses of the titanium and nitrogen precursors, a purge or evacuation step, another nitrogen precursor pulse (referred to elsewhere herein as a "flush"), and then another purge or evacuation step. In some embodiments, both the TiN deposition and the polysilicon deposition are conducted at a relatively low temperature (e.g., 300-600° C., more preferably 400-500° C.). In preferred embodiments, trisilane ($Si_3H_8$) is used as a silicon precursor.

While the above discussion contemplates the in situ deposition of silicon capping films onto TiN films, in some embodiments the deposition sequence of the films is reversed, such that TiN films are deposited in situ onto previously deposited silicon films. For example, in FIG. 1, the silicon deposition 3 can occur before the TiN deposition 2.

Batch Reactor

As mentioned above, the in situ deposition of TiN and silicon films is preferably conducted on a plurality of substrates, such as semiconductor wafers, in a batch reactor. Several exemplary batch reactors are now described.

Preferably, the batch reactor is configured or programmed to deliver one or more precursors in temporally separated pulses. The batch reactor preferably has a vertically extending reaction chamber that accommodates substrates vertically separated from each other, with major faces of the substrates oriented horizontally. Preferably, the reaction chamber accommodates at least 25 substrates, and more preferably at least 50 substrates.

Figure 2:
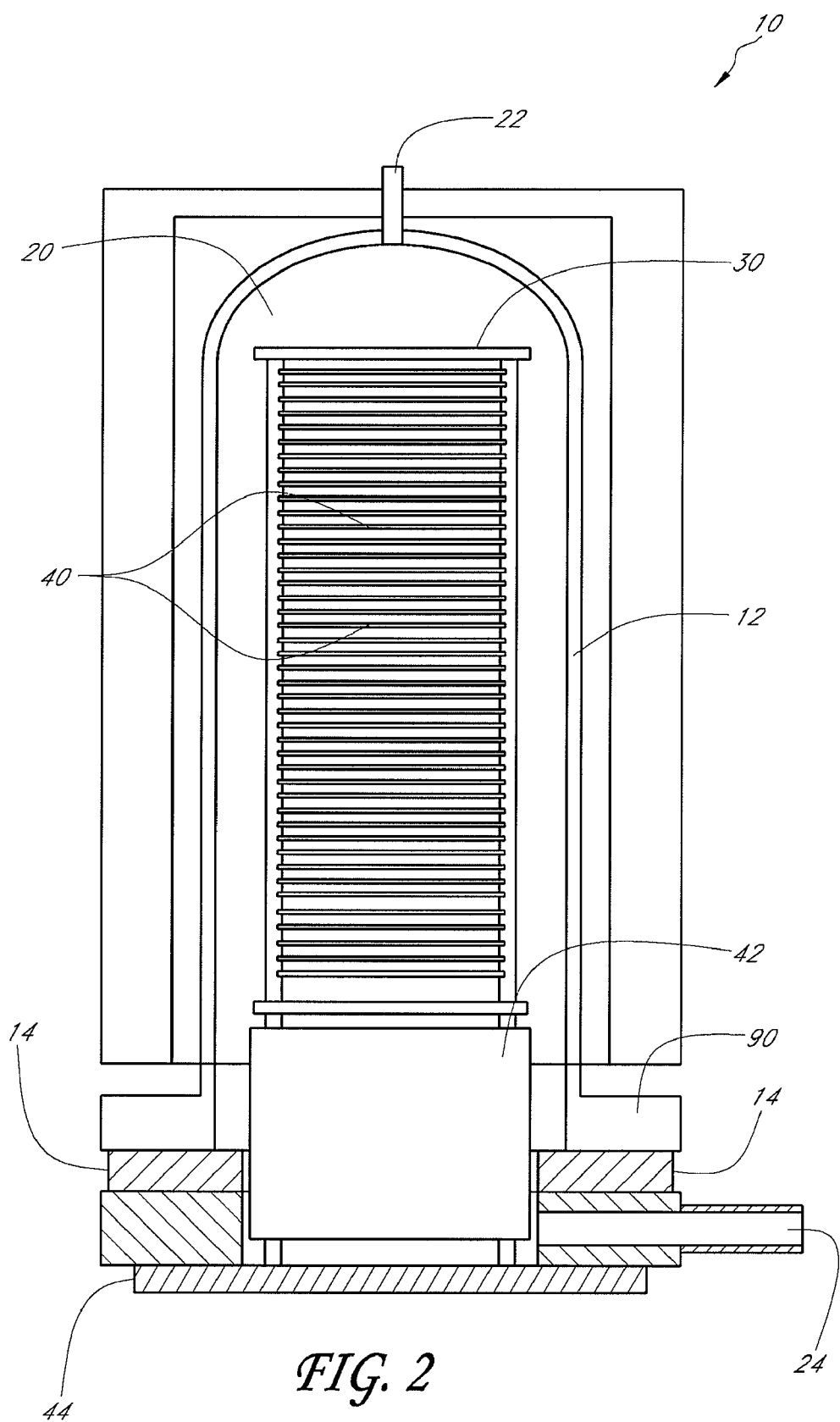
FIG. 2 illustrates an exemplary furnace for use with embodiments of the invention.

FIG. 2 schematically shows a vertical furnace reactor 10 that accommodates substrates 40 vertically separated from one another, and which has benefits for efficient heating and loading sequences. The furnace 10 is preferably adapted to support 100-125 substrates. Examples of suitable vertical furnaces are the A400™ and A412™ vertical furnaces, commercially available from ASM International, N.V. of Bilthoven, the Netherlands. A vertical furnace type of reactor has benefits for efficient heating and loading sequences. It will be understood, however, that while preferred embodiments are presented in the context of a vertical batch furnace, the principles and advantages disclosed herein will have application to other types of reactors. For example, while the illustrated reactors are shown holding substrates in a vertically-separated manner, the methods described herein can be applied to a batch reactor that holds substrates in a horizontally separated manner.

With continued reference to FIG. 2, a tube 12 defines a reaction chamber 20 in the interior of the vertical furnace or reactor 10. The lower end of the tube 12 terminates in a flange 90, which mechanically seals the chamber 20 by contact with a lower support surface 14. Process gases can be fed into the reaction chamber 20 through a gas inlet 22 at the top of the chamber 20 and evacuated out of the chamber 20 through a gas outlet 24 at the bottom of the chamber 20. The reaction chamber 20 accommodates a wafer boat 30 holding a stack of vertically spaced substrates or wafers 40.

The process tube flange 90 can be maintained at an elevated temperature to avoid condensation of process gases on it. It will be appreciated that the elevated temperature can vary from process to process and is preferably chosen based upon the identities of the process gases (which, in some embodiments, are $TiCl_4$, $NH_3$, $Si_3H_8$, and $N_2$). For example, the elevated temperature of the flange 90 is preferably above 120° C., preferably about 180-200° C. Regulation of the temperature of the flange 90 can be achieved by providing it with electrical heaters and a water-cooling system. The water-cooling is desired primarily to avoid overheating of the flange 90 during unloading of a batch of hot wafers 40.

Various systems can be used to supply reactants or precursors to the reaction chamber 20 (FIG. 2). For example, where the precursor is a gas, it can be flowed directly from a gas source to the chamber 20. The timing and rate of the flow of the gas can be controlled by, e.g., mass flow controllers, as known in the art.

Where the precursor, such as $TiCl_4$, is stored as a liquid, a bubbler can be used to supply the precursor to the chamber 20 in gaseous form. The timing and rate of flow of such a precursor can be regulated by controlling the flow of carrier gas through the liquid in the bubbler and by controlling the temperature of the liquid. It will be appreciated that the quantity of the liquid precursor carried by the carrier gas increases with increasing temperature.

Figure 3:
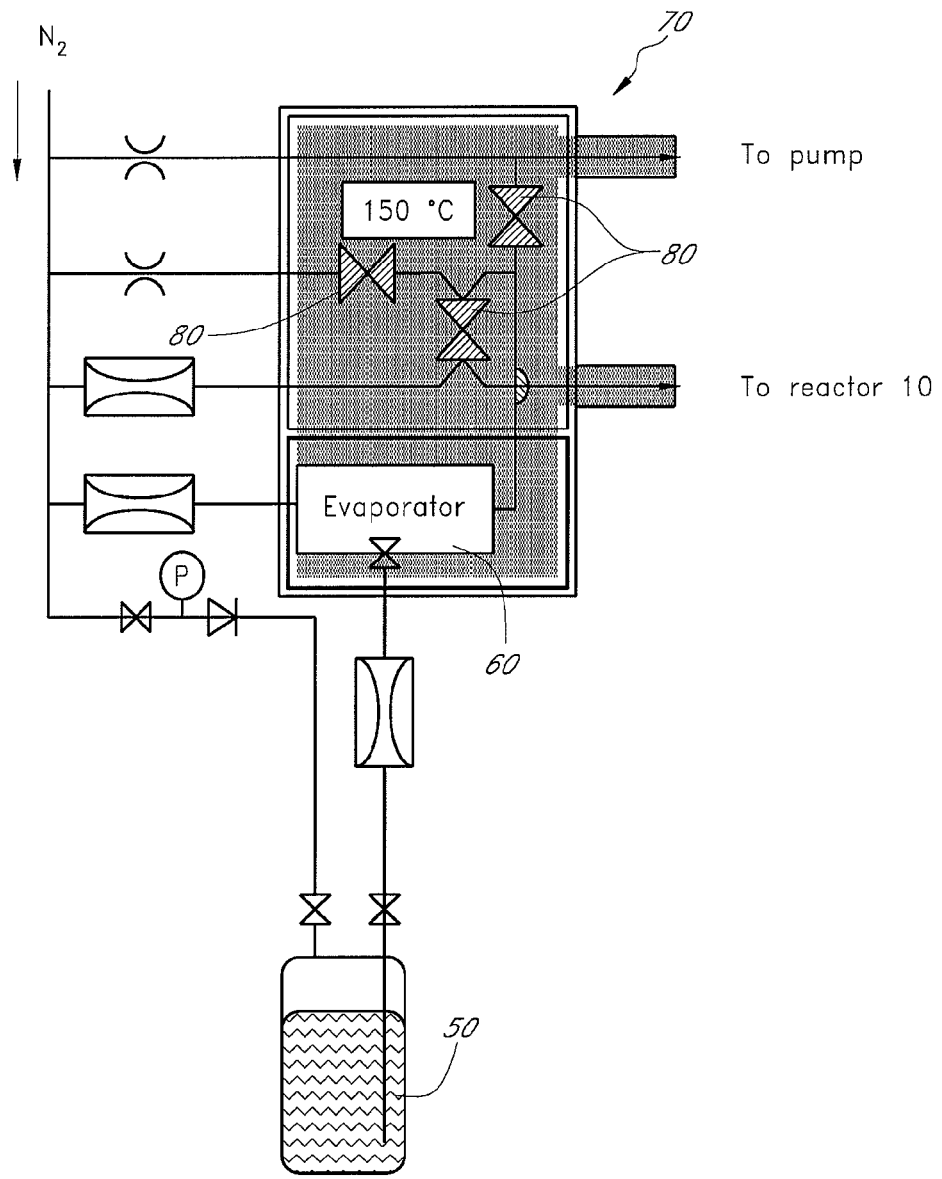
FIG. 3 illustrates an exemplary liquid delivery system for use with embodiments of the invention.

FIG. 3 schematically shows an exemplary system for controlling the flow of liquid precursors, such as $TiCl_4$. The liquid precursor is stored in a container 50. Liquid flow control is used to regulate the amount of the liquid precursor flowing into the reactor 10 by regulating the flow of the liquid into an evaporator or vaporizer 60. After being vaporized, well-separated pulses of a precursor can be generated and flowed into the reaction chamber 20 using a valve system 70 comprising valves 80, shown in the upper section of FIG. 3. Preferably, the valves 80 of the valve system 70 are operated at elevated temperatures and have no or minimal dead volume, to provide good separation between the flow of different reactants. Such a valve system is described in further detail in U.S. Patent Application Publication No. 2004/0250853 A1.

As noted above, process gases can be introduced into the chamber 20 in various ways. For example, in the reactor illustrated in FIG. 2, all gases are introduced into the interior 20 of the reactor 10 at the top, via the top inlet 22, and exhausted at the bottom of the reactor 10, via the exhaust 24. In other embodiments, a more even distribution of the process gases can be achieved over the length of the tube by using multiple-hole injectors for introduction of process gases into the reactor. Suitable multiple-hole injectors are disclosed in U.S. Pat. No. 6,746,240, and U.S. Patent Application Publication No. 2003/0111013 A1. Alternatively, less spacious and cylindrical multiple-hole injectors can be used. Such injectors can have, e.g., a diameter of about 25 mm and holes of about 1 mm diameter. In some preferred embodiments, multiple-hole injectors are preferably mounted on or beneath the flange 90 at the lower end of the reaction chamber 20 and point upwardly.

A multiple-hole injector is preferably not used to introduce a purge gas, however, because the top part of the reaction chamber 20 may be not effectively purged by an injector that only extends part way up the height of the chamber 20. Preferably, a purge gas is introduced into the chamber 20 at the chamber end that is opposite to the exhaust end, so that the purge gas flows through all regions of the reaction chamber 20 after entry and before being exhausted.

Figure 4:
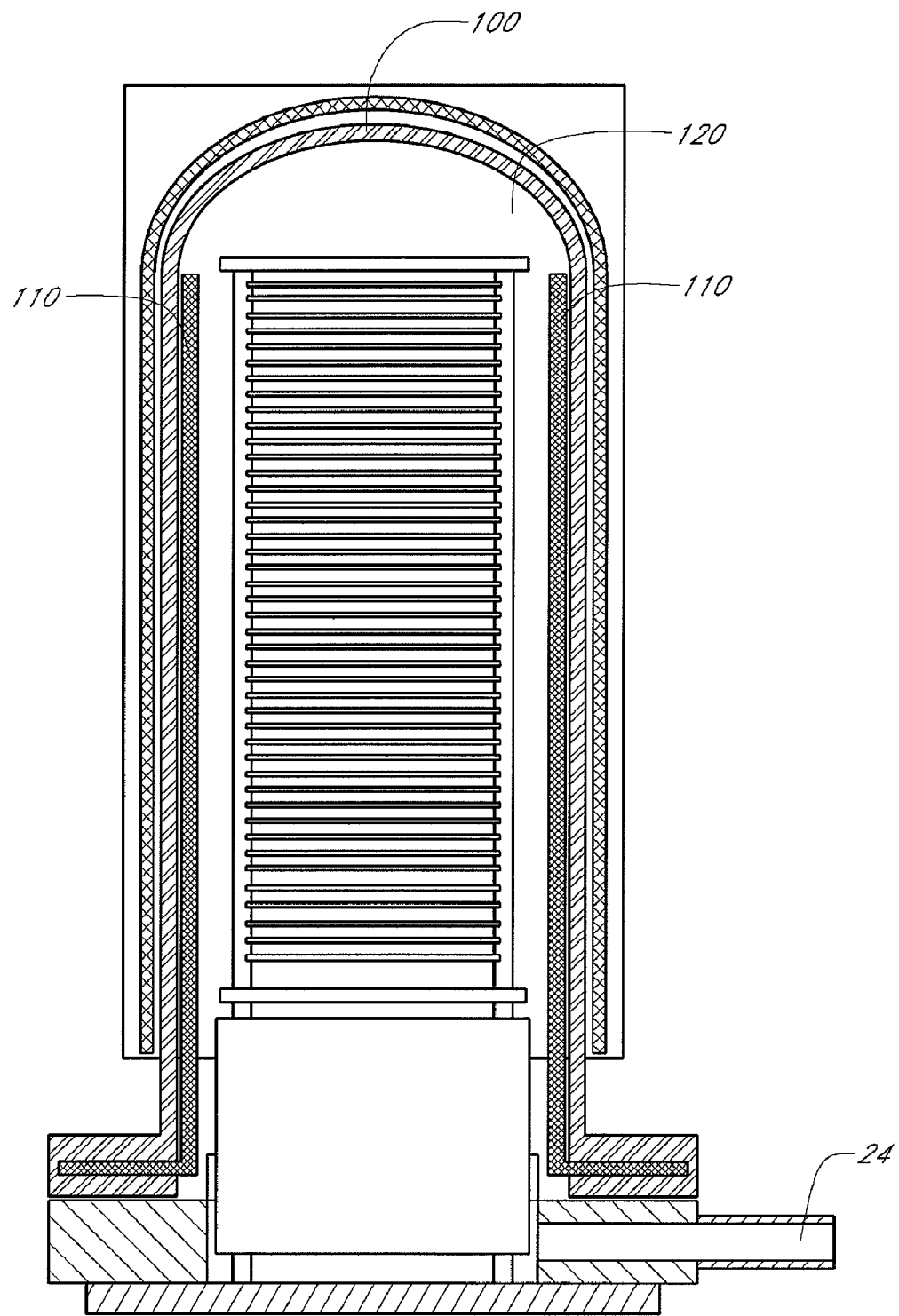
FIG. 4 illustrates another exemplary furnace for use with embodiments of the invention.

FIG. 4 shows another exemplary batch reactor. In this design, the process tube 100 is closed at the top. An advantage of this design is that the process tube 100 is simpler in construction and eventual problems with the gas-tightness and the thermal isolation of the top inlet 22 (FIG. 2) can be prevented. All gases in this set-up are introduced through gas injectors 110, of which two are shown. Preferably, separate injectors 110 are used for each gas. In the case of TiN deposition, one injector 110 can be used for each of the titanium precursor gas (such as $TiCl_4$) and the nitrogen precursor gas (such as $NH_3$). An additional injector 110 can be provided for the silicon precursor gas (such as $Si_3H_8$). These injectors 110 are preferably multiple-hole gas injectors having holes distributed over the height of the tube 100. The injectors 110 may be each oriented substantially perpendicular to the substrates. Each injector 110 may extend along a majority of a length of the arrangement of substrates. An exhaust 24 is provided, preferably at the bottom of the tube 100, for process gases exiting the tube 100.

Figure 5:
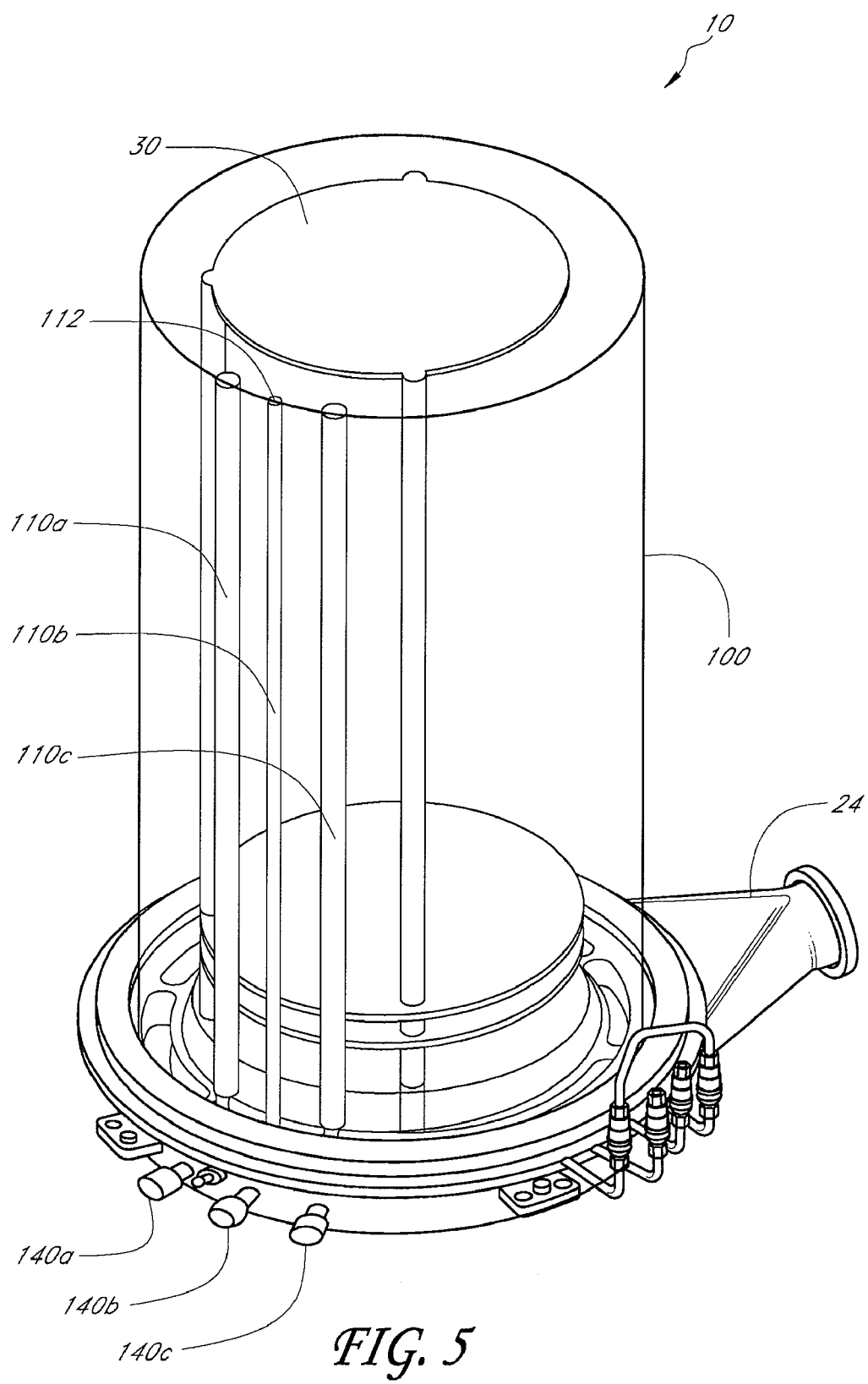
FIG. 5 illustrates an additional exemplary furnace for use with embodiments of the invention.

An additional injector 110 can be used for a purge gas, preferably an inert gas such as nitrogen gas. The injector 110 for the purge gas is preferably a tube with an open end at the top and without gas discharge holes in its sidewall, so that all the purge gas is discharged at the top of the reaction chamber 120. FIG. 5 illustrates a reactor 10 having three vertically extending injectors, 110a, 110b and 110c. The injectors 110a, 110b and 110c each have an inlet 140a, 140b, and 140c, respectively, for connecting to one or more gas feeds. The injector 110b opens at its top end 112 to allow purge gas to flow downward through the reactor 10 and to exit out the exhaust 24 at the bottom of the reactor 10. In other embodiments, the exhaust 24 can be at the top of the reaction chamber 120 and the purge gas can be discharged at the bottom of the reaction chamber 120. Advantageously, using such multiple-hole gas injectors, the evenness of gas distribution into the reaction chamber can be improved, thereby improving the uniformity of deposition results.

Figure 6:
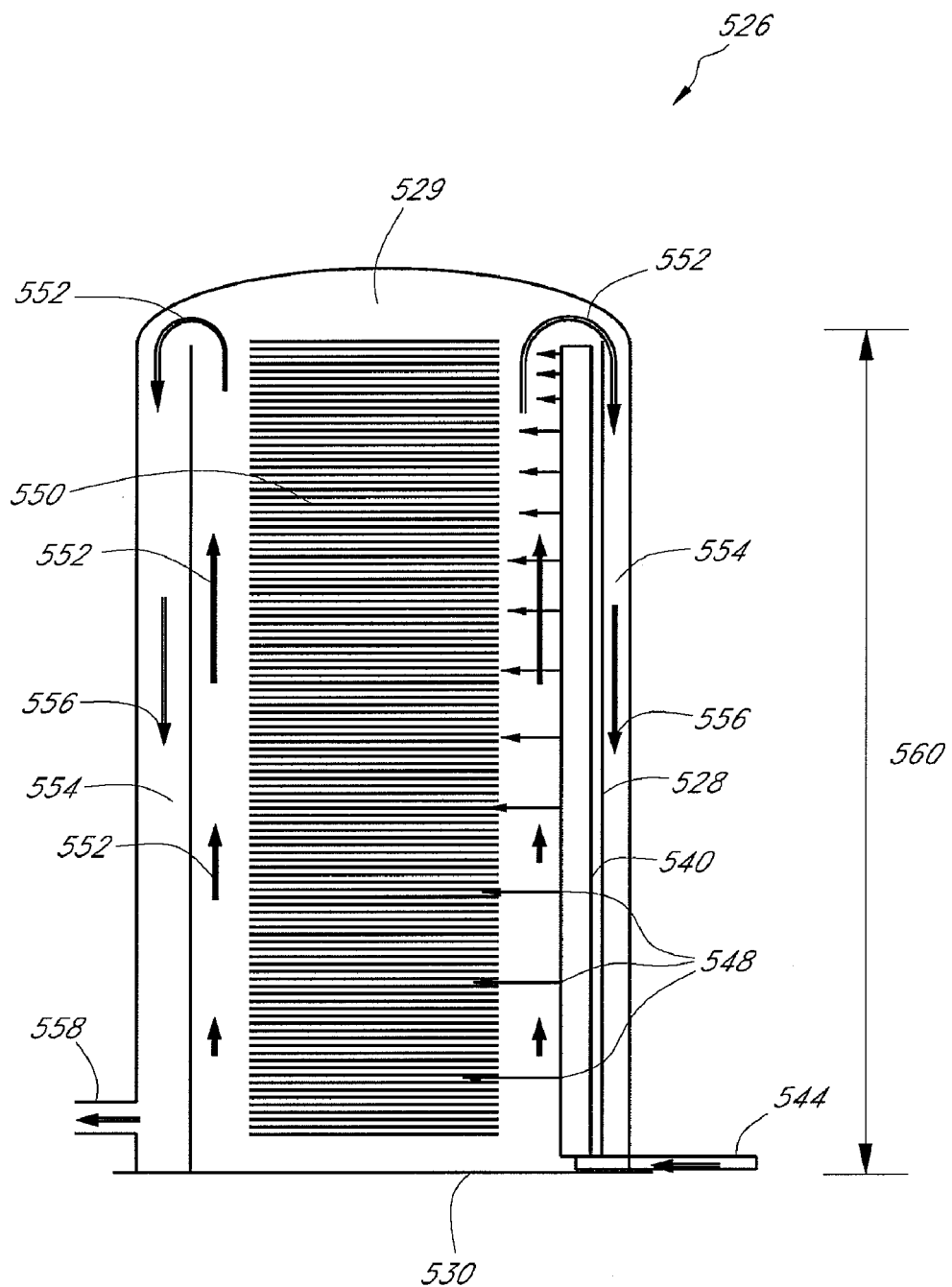
FIG. 6 is a schematic cross-sectional side view of an elongated batch process tube with a gas injector, constructed in accordance with one embodiment of the invention.
Figure 7:
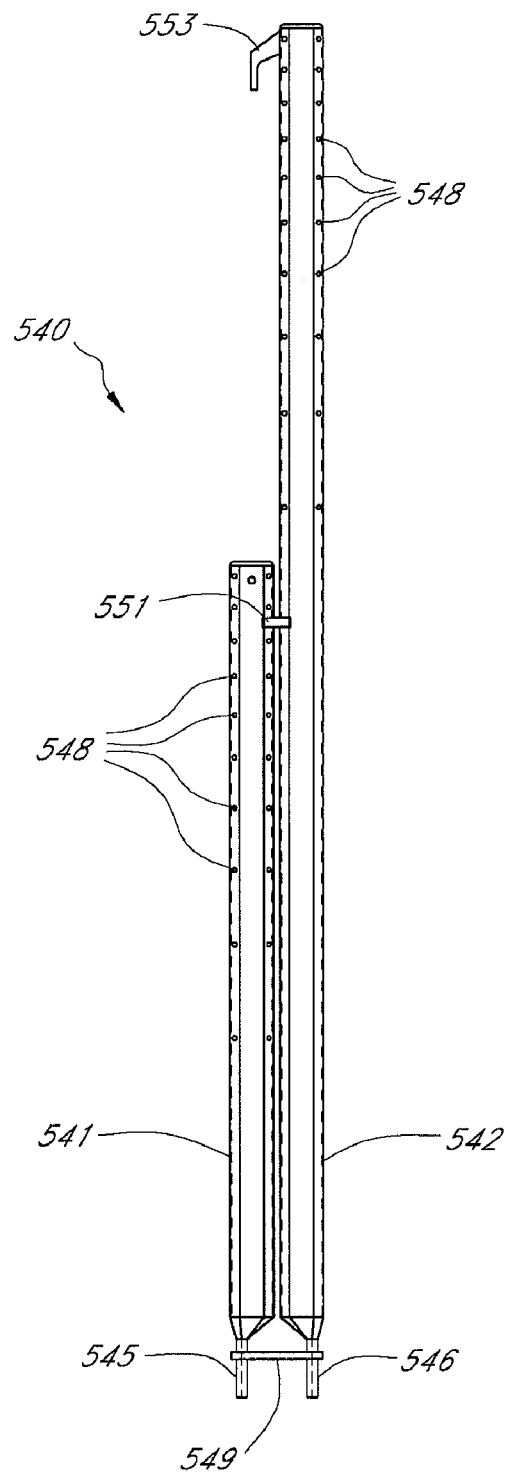
FIG. 7 is a front view of a gas injector for use with the batch process tube of FIG. 6.
Figure 8:
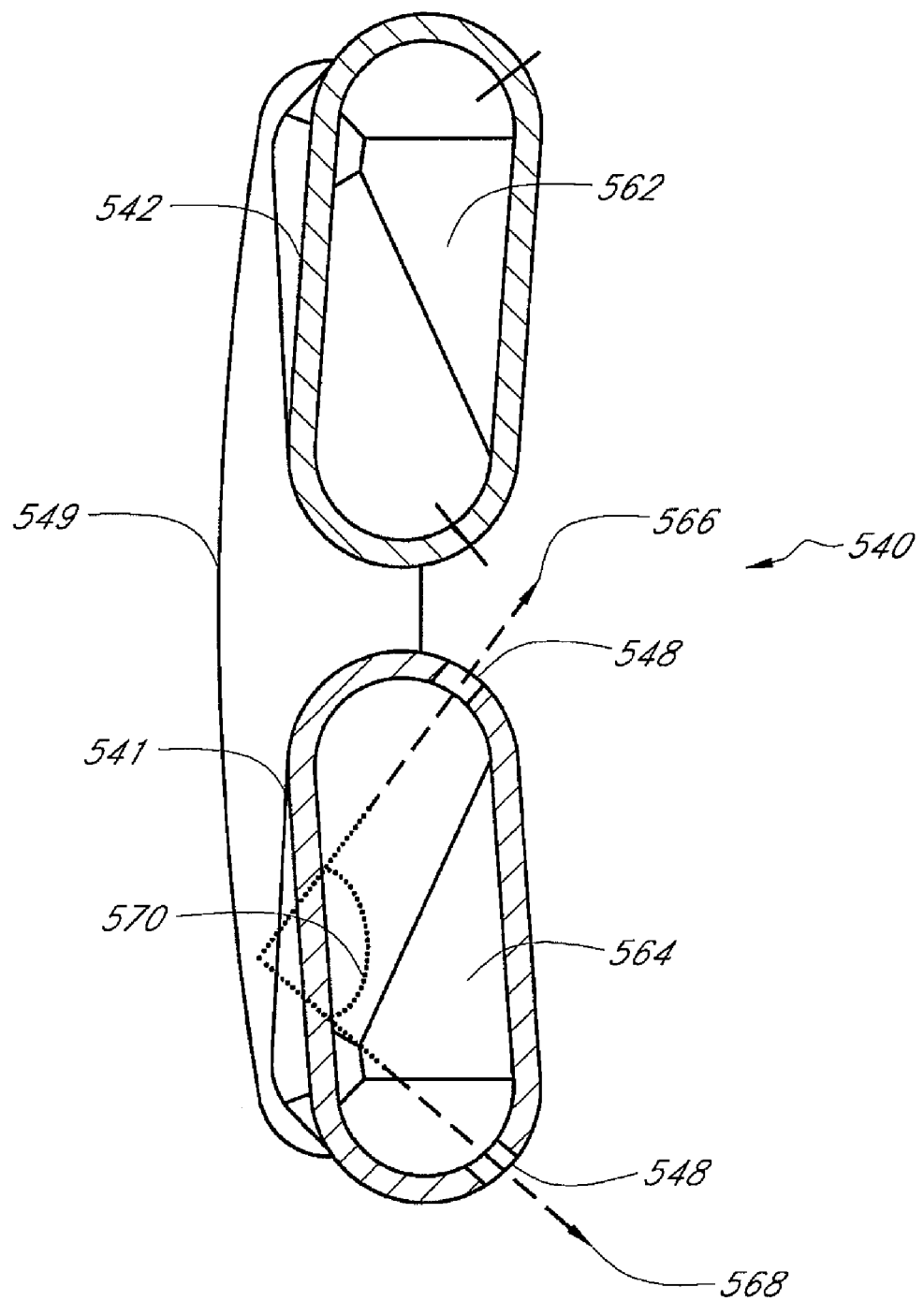
FIG. 8 is a horizontal cross-sectional view of the gas injector of FIG. 7.

FIGS. 6-8 illustrate another version of an exemplary batch reactor, also commercially available under the trade name Advance 412™ or A412™ from ASM International N.V. of Bilthoven, The Netherlands. FIG. 6 is a schematic cross-sectional side-view of the elongated furnace with a gas injector. The process tube or chamber 526 is preferably surrounded by a heating element (not shown). A liner 528, delimiting the outer perimeter of the reaction space 529, is preferably provided inside the process chamber 526. Preferably, at the bottom of the process chamber 526, a wafer load 550 may enter and exit the process chamber 526 by a door 530. Precursor source gas is injected through a gas injector 540, preferably via a gas feed conduit 544. The gas injector 540 is provided with a pattern of holes 548, preferably extending substantially over the height of the wafer load 550. Note that, because gases are first introduced into the reaction space 529 from the holes 548 of the gas injector 540, the interior of gas delivery devices through which gases travel, such as the gas injector 540, is not part of the reaction space 529 and is, in a sense, outside of the reaction space 529. Consequently, the reaction space 529 comprises the interior volume of the process chamber 526, excluding the volume occupied by gas delivery devices such as the gas injector 540. Further details of the chamber 526 are provided in U.S. Patent Application Publication No. 2003/0111013 A1.

In a preferred embodiment, inside the process chamber 526, gas is flowed in a generally upward direction 552 and then removed from the reaction space 529 via an exhaust space 554 between the process chamber 526 and the liner 528, where gas flows in a downward direction 556 to the exhaust 558, which may be connected to a pump (not shown). The gas injector 540 preferably distributes process gases inside the process chamber 526 over the entire height of the reaction space 529. The gas injector 540 itself acts as a restriction on the flow of gas, such that the holes 548 that are closer to the conduit 544 tend to inject more gas into the reaction space than those holes 548 that are farther from the conduit 544. Preferably, this tendency for differences in gas flows through the holes 548 can be compensated to an extent by reducing the distance between the holes 548 (i.e., increasing the density of the holes 548) as they are located farther away from the conduit 544. In other embodiments, the size of individual holes making up the holes 548 can increase with increasing distance from the conduit 544, or both the size of the holes 548 can increase and also the distance between the holes 548 can decrease with increasing distance from the conduit 544. Advantageously, however, the preferred embodiments are illustrated with holes 548 of constant size so as to minimize the surface area of the sides of the gas injector 540 containing the holes 548.

The injector 540 is advantageously designed to reduce the pressure inside the gas injector, resulting in a reduction of the gas phase reactions within the injector, since reaction rates typically increase with increasing pressure. While such reduced pressure can also lead to a poor distribution of gas over the height of the gas injector 540, the distribution of holes 548 across the height of the injector 540 is selected to improve uniformity of gas distribution.

FIG. 7 shows one illustrative embodiment of the gas injector 540. The gas injector 540 preferably comprises two gas injector parts 541 and 542, each preferably provided with separate gas feed conduit connections 545 and 546, respectively. The first part 541 injects gas into the lower volume of the reaction space 529 (FIG. 6) and the second part 542 injects gas into the upper volume of the reaction space 529. The parts 541 and 542 are connected by linkages 549 and 551. At its top end, the gas injector 540 can be provided with a hook 553, to secure the top end of the gas injector 540 to a hook support inside the chamber 526 (FIG. 6).

The gas injector 540 is provided with a pattern of holes 548 substantially extending over the height 560 (FIG. 6) of the wafer load 550. The total cross section of the holes is preferably at least about 30 $mm^2$. The diameter of each of holes 548 is preferably about 1 mm or more, more preferably between about 2.5 mm and 3.5 mm, and in one embodiment about 3 mm. In the illustrative embodiment shown in FIG. 7, the gas injector 540 has a total of 40 holes 548 for a total hole cross-sectional area of about 282 $mm^2$. More generally, the total cross-sectional area of the holes 548 is preferably about 30 $mm^2$ or more, and more preferably between about 196 $mm^2$ and 385 $mm^2$.

With reference to FIG. 8, each part 541 and 542 of the gas injector 540 has an inner cross-sectional area 564 and 562, respectively, available for the conduction of source gases through the gas injector 540. Preferably, each of inner cross-sectional areas 564 and 562 are at least about 100 mm². In the illustrated embodiment, the cross-sectional area of each of the parts 541, 542 of the gas injector 540 is about 330 mm². More generally, the cross-sectional area of each of the parts 541, 542 is preferably between about 140 mm² and 600 mm², more preferably between about 225 mm² and 455 mm².

The cross-section shown in FIG. 8 is taken through the lower end of the gas injector 540 and straight through a pair of injection holes 548 provided in gas injector part 541, for injecting the gas into the lower end of the process chamber 526. Preferably, in each gas injector part, the holes 548 are provided in pairs, at the same height. In addition, the two holes 548 preferably inject the precursor gas in two directions 566 and 568 forming an angle 570 of between about 60 and 120 degrees, illustrated at about 90 degrees, to improve the radial uniformity. Moreover, as shown, the tubes comprising the gas injector 540 preferably have an oblong shape, as viewed in horizontal cross-section. Preferably, the longer dimension of the oblong shape faces the center of the process chamber 526, i.e., the side of the oblong shape with the longer dimension is perpendicular to an imaginary line extending radially from the center of the process chamber 526.

In a preferred embodiment, in a CVD mode, two precursor source gases, providing the two constituting elements of a binary film, are mixed in the gas supply system (not shown) prior to entering the gas injector 540 via feed conduit connections 545 and 546 (FIG. 7). Pre-mixing the precursor gases in the gas supply system is one way to ensure a homogeneous composition of injected gas over the height of the boat. However, the gases can be flowed into the process chamber 526 (FIG. 6) without pre-mixing. In another embodiment, the two precursor source gases can each be injected via their own separate gas injectors 540 (not shown), so that they are first mixed after being injected into the reaction space 529. Consequently, it will be appreciated that more than one gas injector 540 may be located inside the process chamber 526.

Advantageously, the use of two gas injector parts 541 and 542 allows for further tuning possibilities. The flows supplied to the different gas injector parts 541, 542 can be chosen differently to fine-tune the gas flow into the reaction space 529. This will improve uniformity in the deposition rates of precursors over the height 560 of the wafer load 550 (FIG. 6).

One skilled in the art will appreciate that further modifications to the batch reactor, or to the way of operating the batch reactor, known in the art, can be applied to improve the performance of this process. For example, it is possible to use a holder boat or ring boat (i.e., a wafer boat in which each wafer is individually supported by a separate wafer holder or ring-shaped holder inserted into the boat).

It will be appreciated that while the aforementioned hardware configurations are described in the context of pulsed CVD and ALD, they are equally suitable for use in the context of low pressure chemical vapor deposition (LPCVD).

TiN Deposition

It has been found that uniform and low resistivity TiN films can be deposited on wafers in a batch reactor by periodically introducing, or pulsing, one or more precursors into the reaction chamber of the reactor. Preferably, the TiN films are formed using stable titanium and nitrogen precursors, i.e., precursors which are not radicals or a plasma. More preferably, titanium tetrachloride ($TiCl_4$) and ammonia ($NH_3$) are used as the titanium and nitrogen precursors, respectively.

In one method, both precursors (e.g., $TiCl_4$ and $NH_3$) are alternately pulsed into the reaction chamber, preferably with intermediate purge gas injections or chamber evacuation steps. In this method (described below with reference to FIG. 9), each pair of pulses comprises one cycle, and any number of cycles can be conducted. In another method (described below with reference to FIG. 10), only one precursor is pulsed while the other precursor flows continuously into the reaction chamber. In some preferred embodiments, the titanium precursor, e.g., $TiCl_4$, is pulsed into the reaction chamber while the nitrogen precursor, e.g., $NH_3$, is flowed continuously into the chamber. In still another method (described below with reference to FIG. 11), each cycle includes, in the following sequence, substantially simultaneous pulses of the titanium and nitrogen precursors, a purge or evacuation step, another nitrogen precursor pulse (also referred to as a "flush"), and then another purge or evacuation step. The second nitrogen precursor pulse or flush is provided to more fully react nitrogen with any remaining titanium from the prior titanium pulse.

The TiN deposition advantageously can be performed at a temperature of less than about 600° C. and, more preferably, at less than about 500° C., e.g., about 450-500° C. Thus, the deposition is compatible with other processes such as multi-level aluminum or copper metallization. In addition, the deposition can advantageously be used to deposit films on industry standard 200 mm and 300 mm wafers.

Figure 9:
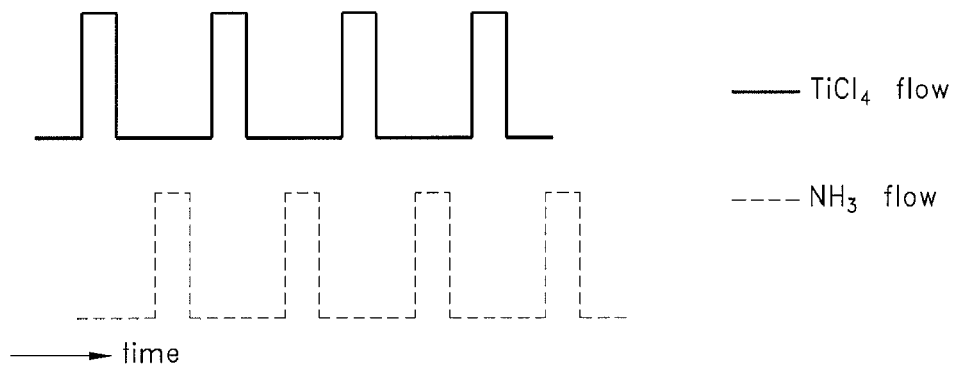
FIG. 9 is a reactant flow rate graph illustrating one method for depositing TiN.

In some preferred embodiments, a stack of vertically-spaced substrates, e.g., semiconductors wafers, is accommodated in a batch reaction chamber and temporally separated pulses of the titanium and nitrogen precursors, such as $TiCl_4$ and $NH_3$, are supplied to the reaction chamber alternatingly and sequentially in an ALD of TiN. FIG. 9 is a reactant flow rate graph illustrating an embodiment of this method for alternate pulses of $TiCl_4$ and $NH_3$. While not shown, it will be understood that chamber purge or evacuation steps can be conducted during time intervals between the alternate pulses of the reactants. In FIG. 9, the $TiCl_4$ and $NH_3$ flows are shown separately for clarity. The cycling sequence preferably ends with a nitrogen precursor gas (e.g., $NH_3$) pulse. In other words, after the last $TiCl_4$ pulse, an additional $NH_3$ pulse is preferably injected, which is not followed by another $TiCl_4$ pulse.

The deposition rate of the TiN has been found to be particularly sensitive to variations in the gas partial pressure of $NH_3$. As a result, $NH_3$ is preferably flowed into the chamber using a gas injector having vertically distributed holes to allow an even distribution of the $NH_3$. Preferably, each reactant is removed, e.g., by purging with an inert gas or evacuating the reaction chamber, before introduction of the other reactant. The duration of each of the pulses is preferably about 60 seconds or less, more preferably about 30 seconds or less, and even more preferably about 15 seconds or less.

When TiN films are formed by continuous CVD, by continuously flowing $TiCl_4$ and $NH_3$ into a reaction, the deposition rate of the TiN films has been found to not vary significantly with the partial pressure of the $TiCl_4$. On the other hand, the deposition rate has been found to be approximately proportional to the partial pressure of the $NH_3$. For depositing uniform films, these findings indicate that the mode of introduction and distribution of $NH_3$ inside the reaction chamber is more important than that for $TiCl_4$, whether or not $NH_3$ is pulsed into the chamber, e.g., whether or not $NH_3$ is used in an ALD or pulsed CVD process. As a result, as noted above, $NH_3$ is preferably discharged into the reaction chamber in a manner that maximizes the evenness of the distribution of the gas into the chamber. In particular, $NH_3$ is preferably discharged into the vertical furnace reaction chamber in a vertically distributed manner, e.g., through a multiple-hole injector having a plurality of vertically spaced apart holes, such as those discussed above. The injector preferably extends substantially over a height of the chamber, such that the holes of the injector span most or all of the vertical height occupied by the substrates. $TiCl_4$ can also be discharged using the multiple-hole injector, or it can be discharged at a feed end of the reaction chamber (FIG. 2).

Figure 10:
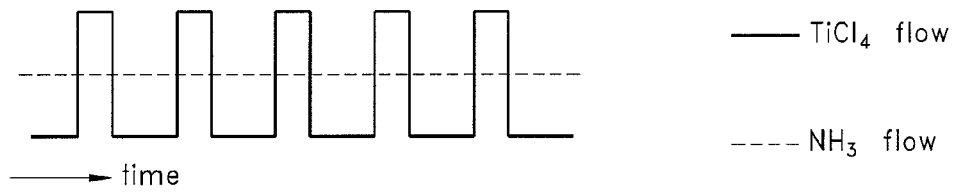
FIG. 10 is a reactant flow rate graph illustrating another method for depositing TiN.

In other preferred embodiments, the nitrogen precursor, e.g., $NH_3$, is continuously supplied to the reaction chamber and only the titanium precursor, e.g., $TiCl_4$, is supplied pulse-wise, resulting in CVD of TiN. FIG. 10 is a reactant flow rate graph illustrating an embodiment of this method for pulsed flow of $TiCl_4$ and continuous flow of $NH_3$. In FIG. 10, the $TiCl_4$ and $NH_3$ flows are superimposed for a better understanding of relative flow rate value. Advantageously, such a deposition scheme allows an increased deposition rate per reactant pulse without losing film quality, in comparison to a scheme in which both $TiCl_4$ and $NH_3$ are alternately pulsed. By continuously flowing one precursor, more than one monolayer of TiN is typically deposited per $TiCl_4$ pulse. In addition, where the titanium precursor pulses are relatively short, the deposited titanium-containing films are effectively nitrided by the nitrogen precursor flow between the titanium precursor pulses. Thus, high quality, low resistivity and uniform TiN films can be obtained at relatively low deposition temperatures of preferably less than about 600° C., and, more preferably, less than about 500° C., e.g., about 450° C. Preferably, the pulse duration is about 60 seconds or less, more preferably, about 30 seconds or less and, most preferably, about 15 seconds or less.

Figure 11:
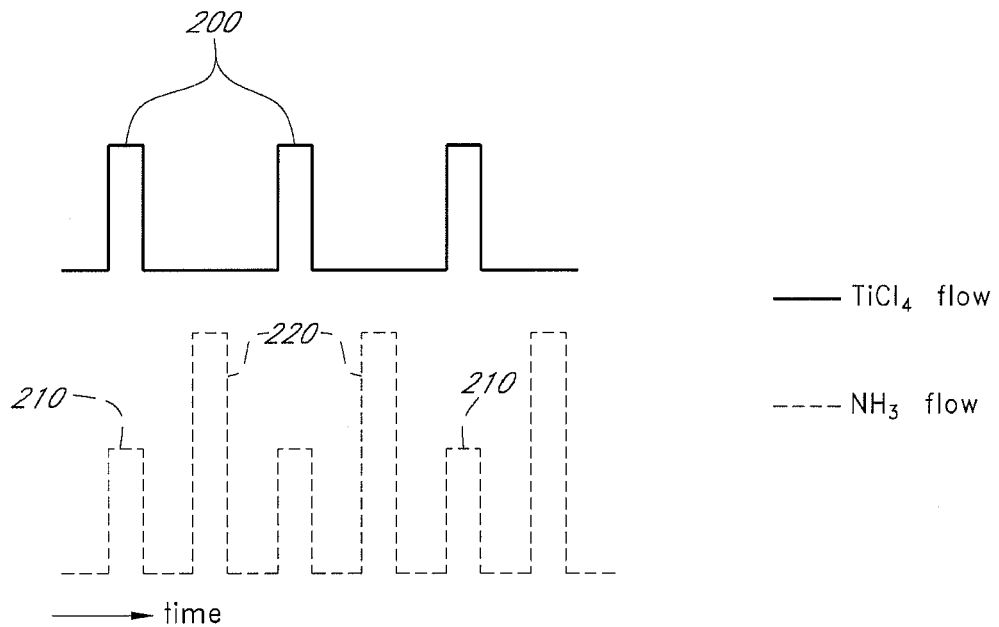
FIG. 11 is a reactant flow rate graph illustrating yet another method for depositing TiN.

In still other preferred embodiments, each deposition cycle includes, in the following sequence, substantially simultaneous pulses of the titanium and nitrogen precursors, a purge or evacuation step, another nitrogen precursor pulse, and then another purge or evacuation step. FIG. 11 is a reactant flow rate graph illustrating an embodiment of this method for pulses of $TiCl_4$ and $NH_3$. FIG. 11 shows the $TiCl_4$ and $NH_3$ flows separately for clarity. In this embodiment, $TiCl_4$ pulses 200 occur substantially simultaneously with $NH_3$ pulses 210. However, an additional $NH_3$ pulse 220 (also referred to as an "ammonia flush") occurs temporally between the combined or simultaneous pulses 200, 210. While not shown, it will be understood that a chamber purge or evacuation step can be conducted after the combined pulse 200, 210 and before the ammonia flush 220. In addition, another chamber purge or evacuation step can be conducted after the ammonia flush 220 and before the next combined pulse 200, 210. In other words, if the pulses 200 and 210 occur during a first time interval of the deposition cycle, and if the pulse 220 occurs during a second time interval of the cycle, then the purge or evacuation steps can be conducted between the first and second time intervals and again after the second time interval.

Advantageously, high quality titanium nitride films can be formed in accordance with the preferred embodiments. For example, the thicknesses of deposited titanium nitride films can vary by less than about 3 nm between substrates in a batch of substrates, and the resistivity can vary by less than about 5 $\mu$Ohm·cm. Moreover, the films can be formed having a low resisitivity of about 220 $\mu$Ohm·cm or less.

Advantageously, at lower deposition temperatures (e.g., 450° C.), the average film thickness across a wafer has been found to be exceptionally uniform from wafer to wafer, varying less than about 3 nm among the various wafers of a batch of wafers. At this temperature, the average resistivity of the films has been found to be advantageously uniform, varying less than about 5 $\mu$Ohm·cm among the various wafers in the batch.

It is understood that precursor pulse time affects film thickness and resistivity. While longer pulse times would be expected to increase or possibly not affect the thickness of the deposited film in cases where the total $TiCl_4$ exposure time was unchanged, it has been unexpectedly found that pulse times longer than about 30 seconds actually cause a decrease in average film thickness (in some experiments, from about 23.5 nm to about 23 nm). Even more unexpectedly, the average resistivity of the deposited film has been found to be strongly dependent on pulse times. In particular, in some experiments, film resistivity has been found to increase from about 220 $\mu$Ohm·cm for $TiCl_4$ pulse durations of about 15 seconds to about 520 $\mu$Ohm·cm for $TiCl_4$ pulse durations of about 60 seconds. Thus, shorter pulse times advantageously allow deposition of TiN films with reduced resistivity, e.g., about 220 $\mu$Ohm·cm or less.

Where both reactants are pulsed, it will be appreciated that pulse times for both reactants can be the same or each can have a different pulse duration. Moreover, whether one or both reactants are pulsed, the duration of the pulses can remain the same throughout a deposition, or can vary over the course of the deposition.

In addition, the cycle duration can be selected to give a desired TiN film resistivity. For example, resistivities of about 520 $\mu$Ohm·cm to about 220 $\mu$Ohm·cm can be achieved by appropriately adjusting the $TiCl_4$ pulse time (e.g., between about 15-60 seconds), or the duration of each cycle of process gases can be adjusted (e.g., between about 1-10 minutes).

Silicon Deposition

As discussed above, a silicon layer can be deposited onto the wafers in the batch reactor either before or after the TiN layer is deposited. The silicon layer may comprise amorphous silicon, and may be deposited by CVD, preferably at a low temperature or a temperature that is the same as or relatively close to the temperature at which the TiN layer is deposited. The deposited silicon and TiN layers can be deposited in direct contact with one another (e.g., immediately adjacent). The silicon layer may be deposited over the TiN layer so as to be a protective capping film. Alternatively, the TiN layer can be deposited over the silicon layer.

Between the steps of TiN deposition and silicon deposition, any excess precursor of associated with the earlier-deposited layer can be removed from the chamber by the injection of a purge gas, by a chamber evacuation process, by displacement of the earlier precursor gas by a gas carrying a reactive species, or any combination thereof. Where the earlier precursor gas is removed by purging, the process chamber is preferably purged for a duration long enough to replace the atmosphere in the chamber at least once.

A silane is preferably used as the silicon precursor. The silane can be selected from the group consisting of monosilane ($SiH_4$), a polysilane and a chlorosilane ($SiH_{4-n}Cl_n$, where n=1 to 4). More preferably, a polysilane is used as the silicon precursor to form the silicon layer, discussed below. As used herein, a "polysilane" has the chemical formula $Si_nH_{2n+2}$, where n=2 to 4. Preferably, the polysilane is disilane or trisilane. Most preferably, the polysilane is trisilane. Consequently, while embodiments of the invention are described in the context of employing CVD cycles with trisilane, the skilled artisan will appreciate, in view of the present disclosure, that certain advantages of the described processes can be obtained with other precursors and/or other deposition techniques.

Trisilane ($H_3SiSiH_2SiH_3$ or $Si_3H_8$) offers substantial benefits when used as a silicon precursor, as disclosed in U.S. Patent Application Publication No. 2005/0118837 A1 and U.S. Pat. No. 6,962,859. For example, films can be deposited with trisilane at substantially lower temperatures than with other silicon precursors, such as silane ($SiH_4$), which advantageously makes possible in situ deposition of both TiN and silicon in a low temperature range (e.g., 400-500° C.). Moreover, deposition rates with trisilane are relatively insensitive to substrate material and thickness. Also, trisilane has an extremely short film nucleation time, which reduces the size of localized crystalline deposits of silicon. As a result, deposited silicon films can be made thinner, while still being uniform. Moreover, the films will show reduced surface roughness due to the reduced size of the localized silicon deposits. In addition, with regards to process throughput, trisilane exhibits higher deposition rates relative to silane. Trisilane also reduces thermal budgets, since it allows use of lower process temperatures than does silane.

Thus, employing trisilane in the deposition methods described herein provides numerous advantages. For example, these deposition methods enable in situ deposition of TiN and silicon layers in a single reaction chamber. These methods also enable the production of silicon-containing compound films that are uniformly thin and continuous. These advantages, in turn, enable devices to be produced in higher yields, and also enable the production of new devices having smaller circuit dimensions and/or higher reliability.

The silicon precursor is preferably introduced into the process chamber in the form of a feed gas or as a component of a feed gas. The feed gas can include gases other than the silicon precursor, such as inert carrier gases. The carrier gas can comprise carrier gases known in the art, such as nitrogen, hydrogen, helium, argon, or various combinations thereof. Where the silicon precursor is trisilane, the trisilane is preferably introduced into the chamber by way of a bubbler used with a carrier gas to entrain trisilane vapor. More preferably, a temperature controlled bubbler is utilized.

In forming the silicon layer, deposition from a silicon precursor can be conducted according to various deposition methods known to those skilled in the art, but the greatest benefits are obtained when deposition is conducted according to the CVD methods taught herein. The disclosed methods can be practiced by employing CVD, including plasma-enhanced chemical vapor deposition (PECVD) or, more preferably, thermal CVD.

Deposition conditions are preferably tailored to processing in the particular type of reactor in which substrates are loaded. In general, deposition conditions are established to supply sufficient energy to pyrollize or decompose the silicon precursor on a hot substrate surface.

In addition, deposition conditions are preferably established so that the reaction rate of the silicon precursor is the limiting variable for the silicon deposition rate. Thus, the ability of hot wall reactors to achieve highly uniform temperature distributions can advantageously be applied to form uniform layers. While depositions conducted under reaction kinetics limited conditions have deposition rates that are sensitive to temperature changes, the ability to establish high temperature uniformity minimizes the effect of this sensitivity. Moreover, reaction kinetics limited conditions advantageously have deposition rates that are relatively insensitive to supplied reactant concentrations.

It will be appreciated that a reaction kinetics limited regime is primarily achieved by use of a relatively low temperature. This results in a reduced film deposition rate that is preferable in a batch furnace. Because of the large batch size, an adequate throughput can still be achieved at a deposition rate that results from temperatures shifted down into the reaction rate limited regime. Advantageously, trisilane enables acceptable deposition rates at very low temperatures, allowing a considerably reduced consumption of thermal budgets. As the skilled artisan will readily appreciate, thermal budgets are constantly reduced as critical dimensions are scaled down, tolerances for diffusion are reduced, and new materials with lower resistance to thermal processing are introduced. The silicon deposition process is preferably operated at a temperature below about 600° C., more preferably below about 525° C., more preferably below about 500° C., more preferably below about 475° C. The silicon can be deposited at a temperature between about 300° C. and about 500° C.

In addition to temperature, the skilled artisan will appreciate that the kinetic regime is partially dependent upon the reactant supply or partial pressure of the silicon precursor. Preferably, the reaction rate is slower than the rate at which reactant is supplied.

The thickness of the deposited silicon film can be varied according to the intended application, as known in the art, by varying the deposition time and/or gas flow rates for a given set of deposition parameters (e.g., total pressure and temperature).

A silicon layer is first deposited by flowing a silicon precursor, preferably trisilane. As noted, process conditions are preferably arranged for deposition in the kinetic regime. The process is preferably operated at a temperature below about 600° C. and, more preferably, at a temperature below about 500° C., and, even more preferably, at a temperature between about 400-450° C. In addition, the reactant supply or partial pressure of trisilane is preferably set at a sufficiently low level to maintain the deposition in the kinetic regime. As long as the reaction rate is slower than the rate at which reactant is supplied, uniformity in a properly tuned batch furnace (in which uniform temperatures can be maintained) is excellent. Reference is made to Sze, VLSI TECHNOLOGY, pp. 240-41 (1988). In the illustrated batch reactors, process pressure is maintained at about 10 Torr or below and more preferably about 1 Torr or below. In order to maintain reaction rate limited deposition, trisilane preferably is supplied at less than about 100 sccm trisilane, and, more preferably, at less than about 20 sccm. The trisilane is typically diluted with a flow of a non-reactive or inert gas such as $N_2$, $H_2$, Ar or He. The trisilane partial pressure is thus preferably below about 10 mTorr, more preferably, about 3-4 mTorr. Preferably, a trisilane deposition step has a duration of about 30-120 seconds.

In addition, the silicon deposition and the TiN deposition (described above) are preferably conducted under generally isothermal conditions. In other words, if the TiN deposition is conducted at a first average temperature and the silicon deposition is conducted at a second average temperature, then the first and second temperatures differ, if at all, by preferably less than 100° C., more preferably less than 50° C., and even more preferably less than 20° C. An "average temperature" refers to a time-averaged temperature, reflecting the possibility that temperature may fluctuate during a deposition process. Conducting the silicon deposition and TiN deposition at the same or similar average temperatures simplifies processing because there is no need to significantly adjust temperature between deposition steps, or to transfer the substrates to a different reactor. In one embodiment, the TiN and silicon depositing steps are both conducted at temperatures within about 400-550° C., and more preferably within about 450-500° C.

Advantageously, the above-described in situ deposition of TiN and silicon within a relatively narrow temperature range can be conducted without producing an undesirable amount of particle generation. As described above, a chamber used for in situ processes at significantly different temperatures results in unacceptable particle generation when one of the processes is silicon deposition, due in large part to the differential in thermal expansion and contraction between the silicon and the other parts of the reaction chamber, such as the chamber walls. Silicon and TiN also have significantly different rates of thermal expansion and contraction, exacerbating the problem for adjacent TiN and silicon layers. However, the presently disclosed embodiments substantially overcome this problem, due to the relatively narrow temperature range within which the TiN and silicon layers are deposited.

EXAMPLE

The following represents process conditions in one example of in situ deposition of TiN and amorphous silicon layers onto a plurality of semiconductors in a batch reaction chamber. For pulsed CVD TiN deposition, temperature in the reaction chamber can be about 450° C., and pressure can be about 200 mTorr. The titanium precursor can be $TiCl_4$, and the nitrogen precursor can be $NH_3$. The $TiCl_4$ can be delivered to the chamber via an $N_2$ carrier gas. The flow rate of $TiCl_4$ during the $TiCl_4$ pulses can be about 1.5 g/min, and the flow rate of the $N_2$ carrier gas can be about 200 sccm. The flow rate of the $NH_3$ during deposition can be about 0.19 slm. The duration of the $TiCl_4$ pulses can be 15 seconds, 30 seconds, or 60 seconds.

As discussed above, the TiN deposition can be conducted in three ways: (1) alternately pulsing the $TiCl_4$ and $NH_3$ precursors into the reaction chamber, preferably with purge or evacuation steps therebetween; (2) continuously flowing one of the precursors (such as $NH_3$) into the reaction chamber while pulsing the other precursor (such as $TiCl_4$); and (3) repeating the following cycle: substantially simultaneous pulses of $TiCl_4$ and $NH_3$, a purge or evacuation step, another $NH_3$ pulse (also known as an "ammonia flush"), and then another purge or evacuation step. The $NH_3$ flow during the ammonia flush can be about 1 slm.

A capping film of amorphous silicon can be deposited in situ onto the TiN layer. The temperature and pressure of the reaction chamber can be maintained at about 450° C. and about 200 mTorr, respectively. Trisilane can be continuously injected into the chamber at a flow rate of about 60 sccm, with an $N_2$ carrier gas flow rate of about 1 slm.

Accordingly, it will be appreciated by those skilled in the art that various other omissions, additions and modifications may be made to the methods and structures described above without departing from the scope of the invention. All such modifications and changes are intended to fall within the scope of the invention, as defined by the appended claims.

I claim:

1. A method of processing semiconductor wafers, comprising:
    loading a batch of semiconductor wafers into a processing chamber;
    depositing titanium nitride (TiN) onto the wafers in the processing chamber; and
    depositing silicon onto the wafers in the processing chamber by performing a thermal chemical vapor deposition at a silicon deposition temperature within about 20° C. of a temperature for depositing titanium nitride, without removing the wafers from the processing chamber between said depositing steps, wherein the silicon precursor is trisilane.

2. The method of claim 1, wherein said step of depositing silicon occurs after said step of depositing TiN.

3. The method of claim 1, wherein said step of depositing TiN occurs after said step of depositing silicon.

4. The method of claim 1, wherein the TiN and silicon depositing steps are both conducted at temperatures within about 400-550° C.

5. The method of claim 1, wherein loading the batch of wafers comprises providing an arrangement of generally parallel wafers spaced from one another, and wherein depositing TiN and silicon comprises flowing precursor gases through gas injector tubes each positioned within the processing chamber and oriented substantially perpendicular to the wafers, each injector tube extending along a majority of a length of the arrangement of wafers, each tube having a plurality of gas injector holes along its length.

6. The method of claim 4, wherein the TiN and silicon depositing steps are both conducted at temperatures within about 450-500° C.

7. The method of claim 5, wherein loading the batch of wafers comprises providing an arrangement of generally horizontal wafers spaced vertically from one another, each injector tube being oriented substantially vertically and extending along a majority of a height of the arrangement of wafers.

8. The method of claim 5, wherein depositing TiN comprises:
    flowing a plurality of separate pulses of a titanium precursor gas through a first of the injector tubes; and
    flowing a plurality of separate pulses of a nitrogen precursor gas through a second of the injector tubes, each of the nitrogen precursor gas pulses occurring temporally between two successive ones of the titanium precursor gas pulses.

9. The method of claim 5, wherein depositing TiN comprises:
    flowing a nitrogen precursor gas through a first of the injector tubes; and
    while flowing the nitrogen precursor gas, flowing a plurality of separate pulses of a titanium precursor gas through a second of the injector tubes.

10. The method of claim 5, wherein depositing TiN comprises flowing nitrogen and titanium precursor gases in accordance with a cycle comprising the following steps:
    flowing a pulse of the nitrogen precursor gas through a first of the injector tubes during a first time interval;
    flowing a pulse of the titanium precursor gas through a second of the injector tubes during the first time interval; and
    flowing a pulse of the nitrogen precursor gas through the first injector tube during a second time interval after the first time interval, wherein the titanium precursor gas is not delivered to the processing chamber during the second time interval.

11. The method of claim 8, wherein depositing TiN further comprises, during each of a plurality of separate time intervals, one of (1) flowing a purge gas into the processing chamber and (2) evacuating the processing chamber, each said time interval being after a pulse of one of the precursor gases and before an immediately following pulse of the other of the precursor gases.

12. The method of claim 8, wherein depositing TiN further comprises flowing an additional pulse of the nitrogen precursor gas through the second injector tube after a last of the titanium precursor gas pulses, said additional nitrogen precursor gas pulse not being followed by another titanium precursor gas pulse.

13. The method of claim 10, wherein the cycle further includes the following steps:
  temporally between the first and second time intervals, one of (1) purging the processing chamber with a purge gas and (2) evacuating the processing chamber; and
  temporally after the second time interval, one of (1) purging the processing chamber with the purge gas and (2) evacuating the processing chamber.

14. The method of claim 10, wherein the titanium precursor gas comprises titanium tetrachloride ($TiCl_4$), and the nitrogen precursor gas comprises ammonia ($NH_3$).

* * * * *